United States Patent [19]

Notley

[11] Patent Number: 5,324,971
[45] Date of Patent: Jun. 28, 1994

[54] POWER SEMICONDUCTOR DEVICE HAVING OVER VOLTAGE PROTECTION

[75] Inventor: Richard P. Notley, Stockport, Great Britain

[73] Assignee: U.S. Philips Corporation, New York, N.Y.

[21] Appl. No.: 45,833

[22] Filed: Apr. 9, 1993

[30] Foreign Application Priority Data

Apr. 9, 1992 [GB] United Kingdom ............... 9207860

[51] Int. Cl.$^5$ ..................... H01L 29/10; H01L 29/06; H01L 29/78
[52] U.S. Cl. .................................. 257/328; 257/133; 257/170; 257/173; 257/339; 257/341; 257/356; 257/367; 257/409; 257/490; 257/495
[58] Field of Search .............. 257/133, 170, 173, 174, 257/328, 335, 339, 341, 356, 367, 409, 488, 490, 495

[56] References Cited

U.S. PATENT DOCUMENTS

| | | | |
|---|---|---|---|
| 4,492,974 | 1/1985 | Yoshida et al. | 257/328 |
| 4,567,502 | 1/1986 | Nakagawa et al. | 257/339 |
| 4,707,719 | 11/1987 | Whight | 257/490 |
| 4,831,424 | 5/1989 | Yoshida et al. | 257/328 |
| 5,128,730 | 7/1992 | Coe et al. | 257/339 |
| 5,162,966 | 11/1992 | Fujihira | 257/328 |

FOREIGN PATENT DOCUMENTS

| | | |
|---|---|---|
| 0190423 | 8/1986 | European Pat. Off. |
| 0372820 | 6/1990 | European Pat. Off. |
| 61-296770 | 12/1986 | Japan ................. 257/328 |
| 2110976 | 4/1990 | Japan. |
| 1138237 | 6/1966 | United Kingdom. |
| 2205682 | 12/1988 | United Kingdom. |

Primary Examiner—Ngan Ngo
Attorney, Agent, or Firm—Steven R. Biren

[57] ABSTRACT

A semiconductor body (2) has adjacent a first major surface (3) a first region (5) of one conductivity type part of which defines an active device area (6) of a power semiconductor device (7) having at least two electrodes (8 and 9 or 8 and 10) and active device regions (11) each forming with the first region (5) a pn junction (11a) extending to the first major surface (3). A protection device (12) formed by a series-connected array of semiconductor rectifying elements (13) is provided on an insulating layer (14) on the first major surface (3). The protection device (12) is connected between at least two electrodes (8 and 9 or 8 and 10) of the power semiconductor device (7) so as to break down to cause conduction between the two electrodes when the voltage across the protection device (12) exceeds a predetermined limit. The active device area (6) is surrounded by field relief means (20) including at least one field relief area (21) extending along the first major surface (3) for causing electric fields within the active device area (6) to spread laterally outwardly of the active device area (6) so as to increase the breakdown voltage of the power semiconductor device (7). The protection device (12) is provided adjacent the field relief means (20) so that the array of rectifying elements (13) extends across the field relief areas (21) thereby enabling the protection device (12) to influence voltages at the field relief area.

12 Claims, 4 Drawing Sheets

POWER SEMICONDUCTOR DEVICE HAVING OVER VOLTAGE PROTECTION

BACKGROUND OF THE INVENTION

This invention relates to a semiconductor component comprising a power semiconductor device and a protection device for protecting the power semiconductor device against excessive voltages.

EP-A-372820 describes such a prior art semiconductor component which comprises a semiconductor body having first and second major surface with, adjacent the first major surface, a first region of one conductivity type part of which defines an active device area of a power semiconductor device having at least two electrodes and active device regions each forming with the first region a pn junction extending to the first major surface, and a protection device comprising a series-connected array of semiconductor rectifying elements provided on an insulating layer on the first major surface, the protection device being connected between at least two electrodes of the power semiconductor device for causing conduction between the two electrodes when the voltage across the protection device exceeds a predetermined limit.

As described in EP-A-372820, the power semiconductor device may be a vertical power MOSFET of the DMOS type and the protection element is formed in thin-film technology as a series of back-to-back pn junction diodes connected between the drain and the control or gate electrode of the power MOSFET. The protection device acts to clamp the voltage across the power semiconductor device to the total avalanche voltage of the diode chain so that any excessive energy, for example a rapid rise in the voltage at the drain electrode during turn-off of an inductive load, will be dissipated by conduction of the power MOSFET resulting from avalanche conduction of the diode chain.

SUMMARY OF THE INVENTION

According to the present invention, there is provided a semiconductor component comprising a semiconductor body having first and second major surfaces with, adjacent the first major surface, a first region of one conductivity type part of which defines an active device area of a power semiconductor device having at least two electrodes and active device regions each forming with the first region a pn junction extending to the first major surface, and a protection device comprising a series-connected array of semiconductor rectifying elements provided on an insulating layer on the first major surface, the protection device being connected between at least two electrodes of the power semiconductor device so as to breakdown to cause conduction between the two electrodes when the voltage across the protection device exceeds a predetermined limit, characterized in that the active device area is surrounded by field relief means comprising at least one field relief area extending along the first major surface for causing electric fields within the active device area to spread laterally outwardly of the active device area so as to increase the breakdown voltage of the power semiconductor device and in that the protection device is provided adjacent the field relief means so that the array of rectifying elements extends across at least one field relief area.

Thus, in a semiconductor component in accordance with the invention the field relief means act to spread laterally, that is along the first major surface, electric fields arising in the power semiconductor device, so increasing the breakdown voltage of the power semiconductor device. Depending upon the precise specification, the power semiconductor device may be required to withstand reverse-biasing voltages of from about 60 volts to many hundreds of volts and the field relief means, in combination with the resistance of the semiconductor body, will be designed to achieve the desired breakdown voltage specification for the device.

Generally, the field relief means of such a power semiconductor device requires a high voltage passivation scheme, typically a layer of a material such as oxygen-doped polycrystalline followed by a layer of a material such as silicon nitride to protect the power semiconductor device and the field relief region from external influences. The present inventor has however found that by providing the protection device across the at least one field relief area, the rectifying elements of the protection device can influence the voltages at the at least one field relief area and may be used, for example, to act as a potential divider which can be used to relieve the edge termination (that is the field relief region) fields of the power semiconductor device and that in such a case the influence of the protection device on the field relief regions is such that it is no longer necessary to protect the field relief means with a high voltage passivation scheme such as the scheme described above. Rather, a low voltage passivation scheme such as a simple insulating layer, for example a layer of lowly phosphous doped silicon oxide (LOPOX) can be used, thereby enabling a reduction in manufacturing costs.

Depending upon the nature and size of the field relief means, the protection device may require very little additional area and may, for example, be accommodated by forming a recess in the power semiconductor device. Especially where the field relief means is quite extensive, as will generally be the case for a high voltage device, the protection device may lie virtually entirely on the field relief means. The semiconductor component incorporating the protection device can have virtually the same area as a semiconductor component without the protection device enabling the protected component to be fitted into the same semiconductor package as an unprotected component.

Each active device region may contain a further region of the one conductivity type and an insulated gate structure may be provided on the first major surface so as to overlie conduction channel regions defined between the further and first regions by the active device regions with the further regions being connected to one main electrode, the first region being connected to the other main electrode and the insulated gate being connected to a control electrode of the power semiconductor device. In this case the power semiconductor device may be, for example, a power MOSFET or an IGBT (Insulated Gate Bipolar Transistor).

The insulated gate structure may have a doped semiconductor, for example doped polycrystalline silicon, conductive gate and the protection device may be formed from the same semiconductor layer so reducing the need for additional processing steps.

The protection device may comprise an array of series-connected thin-film diodes provided by alternate p and n conductivity regions formed in a semiconductor layer such that the array of diodes extends along the semiconductor layer.

The protection device is preferably connected to the field relief means. Thus, for example, the or each field relief area may be connected to a selected one of the rectifying elements so as to enable the voltage at a field relief area to be influenced by the voltage differences along the series of rectifying elements.

The field relief means may comprise one or more field relief regions of the opposite conductivity type formed spaced apart within the first region so as to surround the active device area. Alternatively or additionally, the field relief means may comprise field plate means extending outwardly along the first major surface so as to define a field plate area or spaced-apart field plate areas. Where the field relief means comprises both a field relief region and a field plate area, the field plate area may extend laterally outwardly away from the active device area beyond the associated field relief region.

Where a number of field relief areas are provided, the field relief areas may be formed as concentric spaced-apart rings surrounding the active device area. Where the protection device is provided in a semiconductor layer as a series of pn junction diodes and the field relief means comprises field relief regions, one or more of the field relief regions may be connected to respective regions of the semiconductor layer. A similar connection may be made between the rectifying elements and the field relief areas when the field relief areas comprise field plate areas.

The protection device may be connected between the two main electrodes of the power semiconductor device, that is between the drain and source electrodes in the case of a power MOSFET or between the anode and cathode electrodes in the case of an IGBT. In such a case when the voltage across the two electrodes exceeds the predetermined limit, the protection device will be rendered conducting so that the excessive energy is dissipated via the protection device.

In another example, the protection device may be connected between one main electrode (generally the drain or anode electrode in the case of a power MOSFET or an IGBT) and the control electrode of the power semiconductor device with, for example, another smaller breakdown voltage protection device or resistor being connected between the control electrode and the other main electrode. As another alternative a small part of the protection device could be connected between the control electrode and the other main electrode in addition to between the one main electrode and the control electrode. In both of these cases, when the protection device between the one main electrode and the control electrode is rendered conducting by an excessive voltage at the one main electrode, the voltage at the control electrode of the power semiconductor device will be raised, causing the power semiconductor device to turn on so that the excessive energy is dissipated through the power semiconductor device enabling advantage to be taken of the much higher current handling capability of the power semiconductor device.

It should be noted that EP-B-190423 describes a semiconductor device having a field plate electrode in the form of a semiconductor layer formed on an insulating layer and having alternate p and n conductivity regions. This field plate electrode is connected between the main electrodes of a semiconductor device. In operation of the device, the depletion regions associated with the reverse-biassed junctions within the field plate act as an array of series connected capacitors so that, although no current flows through the field plate, there is a potential gradient along the field plate which serves to shape, in particular reduce the curvature of, the depletion layer of the reverse-biased junctions within the semiconductor device, thereby spreading the electric field laterally to increase the breakdown voltage of the device.

As indicated above, in order for the field plate electrode described in EP-B-190423 to function correctly as an array of series-connected capacitors no current must flow through the field plate. If current were to flow through the field plate, then the field relieving properties of the semiconductor layer which the device is relying upon would be lost.

BRIEF DESCRIPTION OF THE DRAWING

Embodiments of the invention will now be described, by way of example, with reference to the accompanying drawings, in which.

Figure 1:
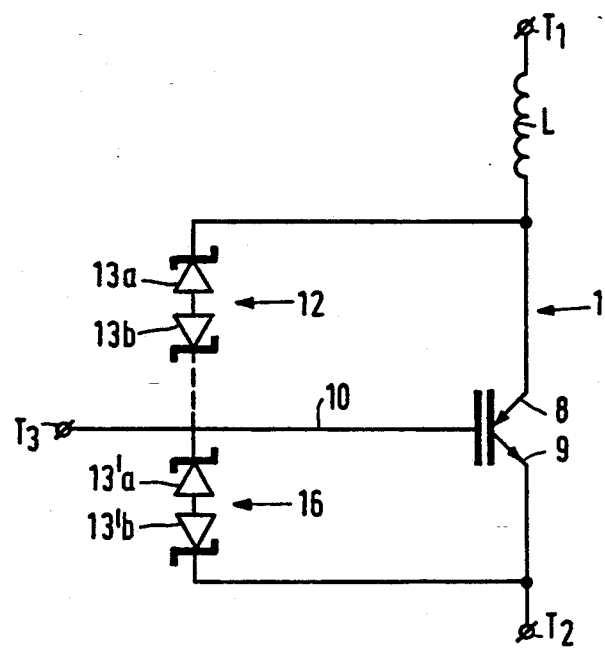
FIG. 1 is a circuit diagram of a first embodiment of a semiconductor component in accordance with the invention.

It should be understood that the Figures are merely schematic and are not drawn to scale. In particular certain dimensions such as the thickness of layers or regions may have been exaggerated while other dimensions may have been reduced. It should also be understood that the same reference numerals are generally used throughout the Figures to indicate the same or similar parts.

DESCRIPTION OF THE PREFERRED EMBODIMENTS

Referring now to the drawing, there is illustrated a semiconductor component 1 comprising a semiconductor body 2 having first and second major surfaces 3 and 4 with, adjacent the first major surface 3, a first region 5 of one conductivity type part of which defines an active device area 6 of a power semiconductor device 7 having at least two electrodes 8 and 9 or 8 and 10 and active device regions 11 each forming with the first region 5 a pn junction 11a extending to the first major surface 3, and a protection device 12 comprising a series-connected array of semiconductor rectifying elements 13 provided on an insulating layer 14 on the first major surface 3, the protection device 12 being connected between at least two electrodes (8 and 9 or 10) of the power semiconductor device 7 so as to break down to cause conduction between the two electrodes when the voltage across the protection device 12 exceeds a predetermined limit. In accordance with the invention the active device area 6 is surrounded by field relief means 20 comprising at least one area 21 extending along the first major surface 3 for causing electric fields within the active device area 6 to spread laterally outwardly of the active device area 6 so as to increase the breakdown voltage of the power semiconductor device 7 and the protection device 12 is provided adjacent the field relief means 20 so that the array of rectifying elements 13 extends across the at least one field relief area 21 to influence voltages at the field relief areas.

The field relief means 20 act to spread laterally, that is along the first major surface 3, electric fields arising in the power semiconductor device 7, so increasing the breakdown voltage of the power semiconductor device 7. Dependent upon the precise specification, the power semiconductor device 7 may be required to withstand reverse-biassing voltages of from about 60 volts to many hundreds of volts and the field relief means 20, in combination with the resistance of the semiconductor body 2, will be designed to achieve the desired breakdown voltage specification for the device.

The field relief means 20 of such a power semiconductor device 7 normally requires a high voltage passivation scheme, typically a layer of a material such as oxygen-doped polycrystalline followed by a layer of a material such as silicon nitride to protect the power semiconductor device 7 and the field relief region 20 from external influences such as extraneous voltages. The present inventor has, however, found that by providing the protection device 12 across the field relief means 20, the rectifying elements 13 of the protection device 12 can influence voltages within the field relief means 20. The inventor has found that the influence of the protection device 12 on the field relief region 20 is such that it is no longer necessary to protect the field relief means 20 with a high voltage passivation scheme such as the scheme described above; rather the field relief means remain stable even if a low voltage passivation scheme such as a simple insulating layer, for example a layer of lowly phosphous doped silicon oxide (LOPOX) is used to provide the passivation. This enables a reduction in the complexity and costs of the manufacturing process.

Depending upon the nature and size of the field relief means, the protection device may require very little additional area and may, for example, be accomodated by forming a recess in the power semiconductor device. Especially where the field relief means is quite extensive, as will generally be the case for a high voltage device, the protection device may lie virtually entirely on the field relief means. The semiconductor component 1 incorporating the protection device 12 can have virtually the same area as a semiconductor component without the protection device enabling the protected component to be fitted into the same semiconductor package as an unprotected component.

Referring now specifically to the drawings, FIG. 1 illustrates the circuit diagram for a first embodiment of a semiconductor component 1 in accordance with the invention.

In this example the power semiconductor device 7 is an insulated gate bipolar transistor (IGBT), the structure of which will be described more fully below with respect to FIG. 3. The examples will be described with reference to an n channel device although it will of course be appreciated by those skilled in the art that the present invention could also be applied to p channel IGBTs. In addition, the power semiconductor device 7 need not necessarily be an IGBT but could be a power MOSFET or a power bipolar device.

In the example illustrated in FIG. 1, the protection device 12 comprises a series-connection of back-to-back diodes which form the rectifying elements 13 and the protection device 12 is connected between the anode electrode 8 (this would be the drain electrode if the device were a MOSFET) and the control or gate electrode 10 of the IGBT 7. As illustrated the anode electrode 8 is connected via an inductive load L (illustrated schematically as a coil) to a first power supply terminal $T_1$ while the cathode electrode 9 is connected to a second power supply terminal $T_2$ which in this case will be at a lower voltage than the first power supply terminal $T_1$ and the gate electrode 10 is connected to a control terminal $T_3$. Alternate ones 13a of the diodes will be reverse-biassed in normal operation of the power semiconductor device while the remaining diodes 13b will be forward-biassed. It is of course the reverse-biassed diodes 13a which will break down, generally by avalanche breakdown, to render the protection device 12 conducting when the voltage at the anode electrode 8 exceeds the predetermined limit. The remaining diodes 13b serve to prevent current flow from the gate electrode 10 to the drain electrode 8 should the gate electrode 10 be at a higher voltage than the drain electrode 8.

In the example illustrated in FIG. 1, when the protection device 12 conducts this will cause the voltage at the gate electrode 10 to rise, thereby switching on the power semiconductor device 7 so that the excessive energy, for example a rapid rise in the anode voltage due to the switching of the inductive load L shown in FIG. 1, is dissipated via the power semiconductor device 7 which should of course be capable of handling far more current than the protection device 12.

A further smaller protection device 16 is connected between the gate electrode 10 and the cathode electrode 9 (this would be the source electrode in the case of a MOSFET). This protection device 16 may simply be a resistor or could be, as shown, a series-connected array of rectifying elements 13a', 13b' similar to the rectifying elements of the protection device 12.

Where the power semiconductor device 7 is a device which is intended to be capable of withstanding a reverse-voltage in the range of from 400 to 800 volts, then the protection device 12 may be designed to have a breakdown voltage of about 400 volts while the smaller protection device 16 may be designed to have a breakdown voltage of about 15 volts. In the example to be described below, where the diodes 13 are formed using thin-film technology as doped polycrystalline silicon diodes with a breakdown voltage of, for example 8 volts, then 45 or 46 diodes 13a and 2 diodes 13a' may be used for the above power device specification with an equivalent number, in each case, of normally forward-biassed diodes 13b and 13b'.

Figure 2:
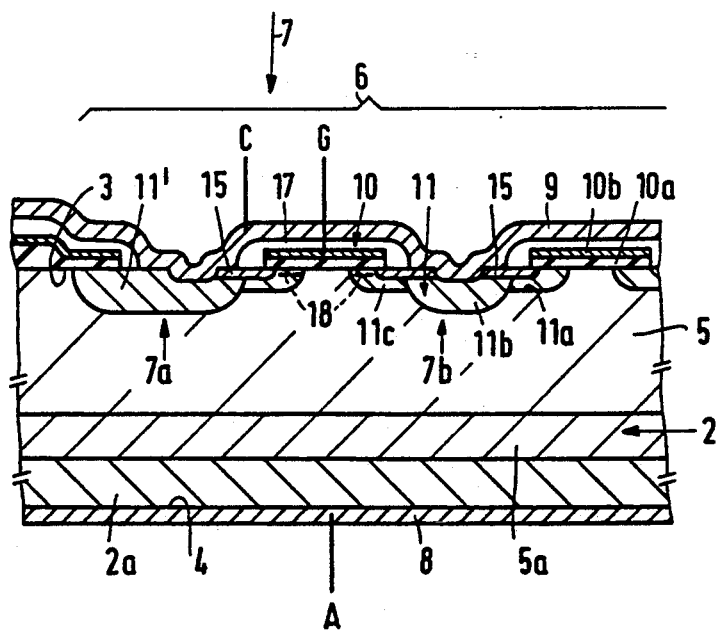
FIG. 2 is a cross-sectional view through part of a semiconductor body for illustrating part of a power semiconductor device suitable for use in a semiconductor component in accordance with the invention.

FIG. 2 illustrates a cross-sectional view through part of the semiconductor body 2 to show a typical example of an IGBT cell structure which may be used in a semiconductor component in accordance with the invention. The cross-section of FIG. 2 is through a part of the IGBT adjacent its periphery and so shows a peripheral IGBT cell 7a and a normal IGBT cell 7b. As will be appreciated by those skilled in the art, the IGBT 7 will normally consist of a regular array of many hundreds of cells 7b with an outer periphery formed by the periphery cells 7a.

In this case, the semiconductor body 2 comprises a monocrystalline silicon substrate 2a, which is highly doped and is of p conductivity type, to which ohmic contact is made by the anode A electrode 8.

An epitaxial layer of silicon which is relatively lowly doped and of n conductivity type is provided on the substrate 2a to form the first region 5. A buffer layer 5a of n conductivity type but more highly doped than the layer 5 may be provided between the layer 5 and the substrate 2a. The thickness and resistivity of the epitaxial layer 5 will be selected, as is well known in the art, so as to be suitable for the required device voltage rating.

Each IGBT cell 7b comprises an active device or body region 11 which is of p conductivity type and generally, as is known in the field of power MOSFET and IGBT technology, consists of a more highly doped deep central subsidiary region 11b and a conduction channel region defining relatively lowly doped and shallow peripheral subsidiary region 11c. A further region 15 which is relatively highly doped and of n conductivity type is provided within each body region 11 and an insulated gate structure 10 is formed on the first major surface 3. Generally the insulated gate structure comprises a thermal oxide layer 10a and a doped polycrystalline silicon layer 10b. Normally the shallow subsidiary regions 11c and the further regions 15 will be formed in a so-called self-aligned manner using the insulated gate structure as a mask.

The insulated gate structure 10 provides a gateable connection between the further regions 15 and the first region 5 via the conduction channel regions 18 provided by the body regions 11.

An insulating layer 17 is provided over the insulated gate structure 10 and metallization, for example aluminum, deposited and defined to provide the cathode C electrode 9 and the insulated gate G electrode metallization (not shown) which makes contact to the insulated gate structure 10 via one or more windows (not shown) in the insulating layer 17. As is conventional, each further region 15 is electrically shorted by the electrode 9 to the associated body region 11 to inhibit parasitic bipolar action. This may be achieved by etching a moat through the center of each cell as shown or by masking the central portion of each cell from the impurities introduced to form the further regions 15. Although not shown in FIG. 2, each cell 7a, 7b may have an additional p conductivity region of higher conductivity than the shallow region 11c and formed so as to be beneath the further region 15 but so as not to extend into the conduction channel region 18 so as to further reduce the possibility of parasitic bipolar action.

The peripheral cells 7a are similar to the remaining cells 7b except that the further regions 15 are omitted (or overdoped) from the outer part of the cell and the outer periphery of the cell is formed by a relatively deep relatively highly doped p conductivity region 11'.

If it is desired for the power semiconductor device to be a power MOSFET rather than an IGBT then that can be achieved simply by providing the highly doped substrate 2a of the same (rather than the opposite) conductivity type as the epitaxial layer 5 and by omitting the buffer layer 5a.

Figure 3:
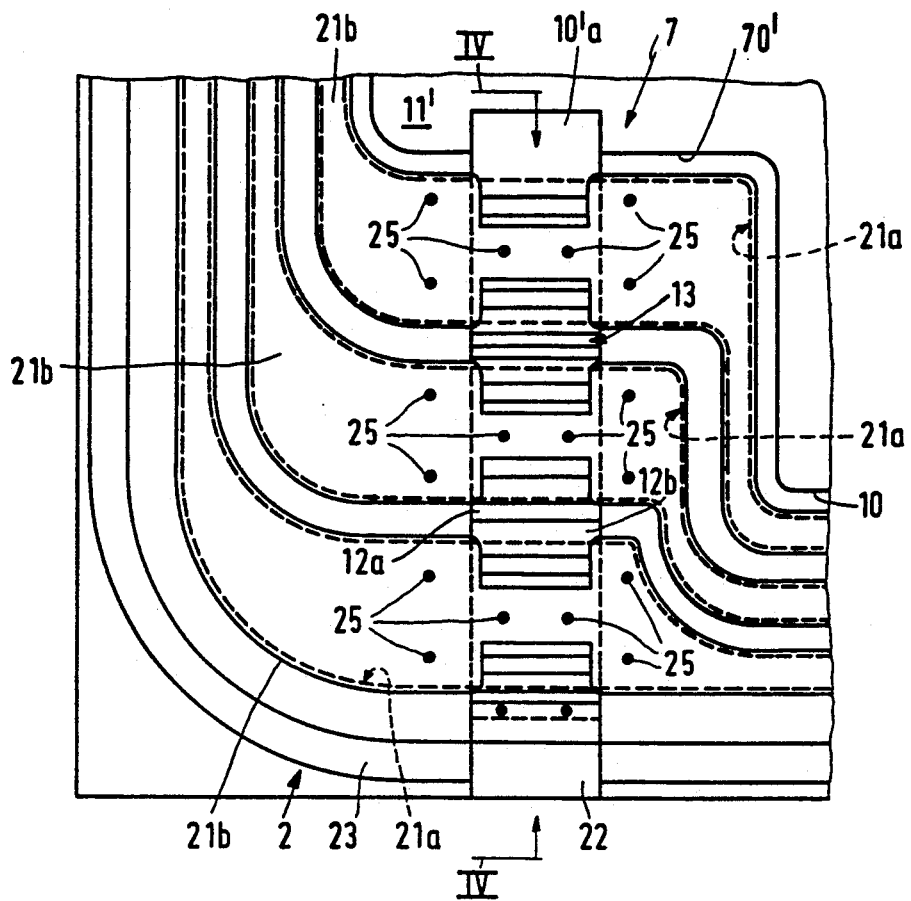
FIG. 3 is a plan view of part of a semiconductor body for illustrating the protection device and part of the field relief means of the first embodiment of a semiconductor component in accordance with the invention.

FIG. 3 illustrates very schematically in plan view part of the semiconductor body to show one example of the field relief means 20 and the location of the protection device 12. It should be appreciated that only those layers and regions which are necessary to explain the relationship between the field relief means 20, the protection device 12 and the periphery 70 of the power semiconductor device 7 are shown in FIG. 3.

The periphery 70 of the power semiconductor device 7 is represented in FIG. 3 by part of the peripheral p conductivity region 11' of the peripheral cells 7a. These peripheral regions 11' may be joined together so as to form a continuous guard ring around the periphery of the power semiconductor device 7.

Figure 4:
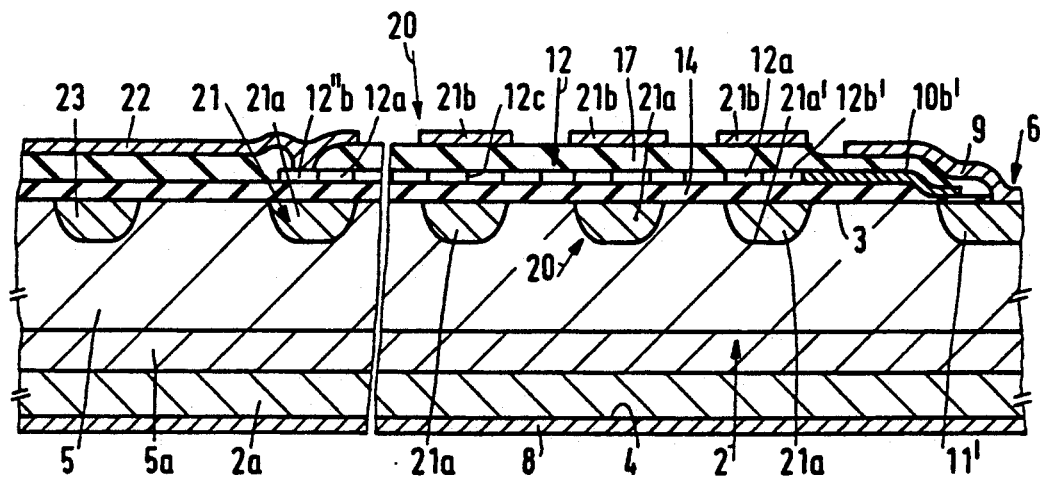
FIG. 4 is a cross-sectional view, part broken away, taken along line IV—IV in FIG. 3 of part of the semiconductor body of a similar semiconductor component for illustrating the protection device and part of the field relief means.

In the example illustrated in FIG. 3, the periphery of the power semiconductor device 7 is surrounded by a number of field relief regions 21a which are formed within the first region 5, outside the active device area 6, so that, as shown in FIG. 4, each field relief region 21a forms with the first region 5 a pn junction 21a' which meets the first major surface 3. The field relief regions 21a are spaced-apart from one another and from the peripheral region 11' of the power semiconductor device 7. In the example illustrated, the field relief regions 21a are formed as concentric rings (four are shown in FIG. 4 but in the interests of clarity only three of these rings are shown in FIG. 3) having a geometry, when viewed in plan, which follows that of the periphery of the power semiconductor device 7, for example circular or square or rectangular (with rounded corners). Each ring may be divided into a number of discrete regions. As described in GB-A-1138237, these field relief rings 21a are located and spaced so that the depletion region associated with the pn junction between the peripheral region 11' and the first region 5, which pn junction is reverse-biassed in normal operation of the device 7 extends so that the field relief regions are located within its spread. This has the effect of spreading the depletion region and thus the electric field laterally (that is along the first major surface 3) thereby reducing the electric field at the surface and increasing the breakdown voltage of the device 7.

The field relief regions 21a may be of variable width and/or depth as described in EP-A-115093 and EP-A-124139. Furthermore, although only four field relief regions 21a are shown in FIG. 4, it will be appreciated by those skilled in the art that the number and spacing of the field relief regions 21a will depend on the power device 7 characteristics, in particular its desired voltage rating or breakdown voltage.

The field relief regions 21a may be formed, using an appropriate mask, at the same time as the peripheral regions 11' and are covered by the insulating layer 14.

The protection device 12 is, in this example, provided on top of the insulating layer 14 in a recess 70' formed in the periphery of the power semiconductor device 7 so that the length of the array of series-connected rectifying elements 13 extends transversely of the field relief regions 21a. The insulating layer 14 should not be so thin that the protection device 12 exerts an undue influence on the field relief region 21a. Typically, the insulating layer 14 will be at least 0.8 μm (micrometers). As illustrated schematically in FIG. 3, the field relief regions widen out in the vicinity of the protection device so that the field relief regions expand to fill the area defined by the recess 70' while maintaining a substantially constant spacing between adjacent field relief regions 21a.

As indicated schematically in FIGS. 3 and 4, in this example the protection device 12 is formed from a semiconductor layer which may be the same semiconductor layer, for example a polycrystalline silicon layer, which is used to define the conductive gate layer 10b. The rectifying elements 13 are formed as pn junction diodes by alternately doping, using suitable masks, areas of the semiconductor layer with p and n conductivity type dopants to form p and n conductivity type regions 12a and 12b such that the pn junctions 12c therebetween extend through the semiconductor layer in a direction transverse (as shown perpendicular) to the length of the array.

The protection device 12 is provided, in this example, on top of the insulating layer 14 on the field relief regions 21a so that the pn junctions 12c extend in a direction parallel to the edges 21a' of the field relief regions 21a. It will be appreciated from the above that the protection device 12 may consist of many (for example up to about 90) diodes 13a and 13b where the voltage at which clamping is required is about 400 volts. In the interests of simplicity in FIG. 4, the semiconductor layer forming the protection device 12 is shown unhatched and the pn junctions 12c are indicated schematically for only a few of the diodes. Typically, where the power semiconductor device 7 has a design such that the voltage difference between the rings in operation of the device 7 is about 70 volts, then the protection device 12 may be arranged such that the number of rectifying elements between adjacent rings is such as to provide a potential drop of about 50 volts between a rectifying element at a given position over one ring 21a and another rectifying element 13 at a similar position over the adjacent ring 21a.

The cathode region 12b' of the diode 13 closest to the periphery region 11' of the power semiconductor device 7 is, in this example, electrically connected to the insulated gate structure 10. This may be achieved by appropriate patterning of the metallization used to form the electrodes 9 and 10 or, as shown in FIG. 4, by an appropriately doped extension 10b' of the gate conductive layer 10b. The cathode 12b'' of the diode 13 at the other end of the protection device 12 array is connected by part 22 of the metallization layer used to form the electrode 8 to the same potential as the drain or anode of the power device semiconductor device. This may be achieved by effecting an electrical connection (not shown) by means of a wire or the like from the part 22 to the drain or anode or could possibly be achieved by a connection to a highly doped n conductivity region 23 which surrounds the field relief regions 21a. The highly doped n conductivity region 23 acts as a channel stopper and also provides ohmic contact from the protection device 12 to the first region 5 with the conductive path to the anode electrode 8 being completed by the p conductivity type substrate 2a.

The smaller protection device 16 is not subjected to such high voltages as the protection device 12 and, although not shown, may thus be formed, in a manner similar to the protection device 12, at any appropriate area on the semiconductor body for example in a recess within the area of the power semiconductor device 7 but not necessarily adjacent the field relief means 20. Electrical connection to the protection device 16 may be made by appropriate patterning of the gate conductive layer 10b and the electrode 9. Alternatively the smaller protection device 16 could just be formed as a, for example, doped polycrystalline silicon resistor by an extension (not shown) of the gate conductive layer.

As shown in FIGS. 3 and 4, the field relief means comprises field plate areas 21b in addition to the field relief regions 21a as described in, for example, GB-A-2205682. The field plates 21b may be electrically isolated from the field relief regions 21a by the insulating layer 14 or may, by means of appropriate windows in the insulating layer, make electrical contact with the field relief regions 21a as described in DE-A-3338718. FIG. 3 indicates by means of contact areas 25 (shown simply as solid black dots in FIG. 3) an electrical connection from the field plates 21b to the field relief regions 21a. Generally each field plate 21b extends along the entirety of the underlying field relief region 21a.

In order to reduce the possibility of undesired electrical shorts between the field relief plates 21b and the protection device 12, the field plates 21b may be reduced in width (as shown in FIG. 3 but not in FIG. 4 or any subsequent Figures) where the field relief plates 21b cross the protection device 12.

In the example illustrated by FIGS. 3 and 4, the protection device 12 is connected to the field relief means 21 by making electrical contact between certain regions of the semiconductor layer forming the diodes 13 of the protection device 12 and the field relief means 20. As shown in FIG. 3 this is achieved by contact areas 25 connecting the field plate areas 21b at given points to selected regions of the diodes 13 of the protection device 12. Generally for ease of effecting an ohmic contact the connection will be made to n conductivity type regions 12b of the diodes 13, although contact could be made to the p conductivity type regions 12a.

Also although not shown in FIGS. 3 and 4, the regions of the diodes 13 to which ohmic contact is made by metallization to, for example, connect the protection device to the part 22 of the metallization and to enable connection between the protection device 12 and the field relief areas 21a, 21b may be enlarged relative to the other regions 12a, 12b of the diodes 13 to enable good ohmic contact.

The field relief regions 21a may be floating, that is not connected to any fixed electrical potential. As an alternative, as shown in FIG. 3, electrical connection may also be made between selected regions of the layer forming the protection device diodes 13 and the field relief regions 21a by providing electrical contact areas between the field plates 21b and the field relief regions 21a so that the field relief regions are connected to selected ones of regions forming the protection diodes 13 via the associated field relief plates 21b. In this case care has to be taken in selecting the geometry, size and spacing of the field relief regions and the selected regions of the protection device 12 so that the potential differences induced between the field relief regions 21a by virtue of the electrical connection are compatible with the field relief region structure.

By selecting the n conductivity regions 12b (or p conductivity regions 12a, although better contact should be possible to n conductivity type polycrystalline silicon) of particular diodes 13 for connection to the field plate areas 21b, the potential (voltage) at each field plate area 21b can be controlled or at least influenced by the voltage drop along the protection device 12. Thus, as an example, where the power semiconductor device 7 is designed to have a 50 to 100 volt potential difference between adjacent field relief regions 21a, then connection may be made between the protection device 12 and the field relief means 20 so that the voltage difference between the n conductivity region 12b of the diode 13 connected to one field relief region 21a and the n conductivity region 12b of the diode 13 connected to the adjacent field relief region 21a will be about 70 volts. Of course the voltage drop between the diodes connected to adjacent field relief regions 21a, 21b may vary depending upon the location of the field relief regions 21a, 21b and may for example increase away from the active device area 6.

The breakdown voltage (that is the voltage at which the protection device starts to conduct generally by avalanche conduction) of the protection device 12 will, of course, be less than that of the power semiconductor device 7. The protection device 12 acts to passivate the field relief region 20 of the power semiconductor device 7. Thus, below the breakdown voltage of the protection device 12, the voltage drop along the series of diodes 13 will resemble that described in EP-B-190423 and the series of diodes will act as a potential (voltage) divider. Moreover even when the protection device 12 breaks down into conduction it will still function as a voltage divider. The protection device 12 thus serves as a voltage divider which influences the potential of the field relief areas 21 and it has been found that this use of the protection device 12 to passivate the field relief (edge termination) region 20 of the power semiconductor device 7 enables the use of relatively complex and costly high voltage passivation structures to be avoided and allows a low voltage passivation structure to be used without causing instabilities in, in particular, the field relief regions 21a. Thus, for example, the insulating layer 17 may be formed simply by a layer of lowly phosphorus doped silicon oxide (LOPOX) rather than a more costly and complicated structure, such as a layer of oxygen doped polycrystalline silicon followed by a layer of silicon nitride, which would be required for high voltage passivation.

It is believed that the present invention allows for this simplification of the passivation scheme because, although the protection device 12 itself is a high voltage device, each of the rectifying elements 13 is a low voltage (generally about 8 volts) device which requires only low voltage passivation and this characteristic of the rectifying elements 13 is impressed onto the field relief means 20. Furthermore because the protection device 12 is made up of a series of similar (generally identical) diodes any instability (voltage fluctuations) which may occur in the chain of diodes 13 should be the same for each diode 13 so that although the absolute voltages may differ the potential differences along the chain of diodes 13 and thus the potential difference between the field relief regions 21a should not change significantly.

Although the structures shown in FIGS. 3 and 4 have several field relief regions, the actual number will depend upon the voltage rating of the power semiconductor device 7, and for a relatively low voltage device (for example a 300 volt device), the field relief means may consist of a single field relief region 21a and field relief plate 21b.

As a further alternative, the field relief regions 21a may be omitted and only the field plates 21b provided. In this case the field plates 21b may be in the form of concentric rings surrounding the active device area 6. In each case the field plates 21b may be formed of the same metal as the electrode 8. In a further alternative, the field plate areas 21b may be formed of a resistive material, for example doped polycrystalline silicon. Where the field plate areas 21b are formed of resistive material then they may have a continuous spiral form as shown in GB-A-1394086 so that the field plate areas 21b form spaced-apart sections of one continuous spiral.

In one example of a 300 volt rated power semiconductor device, the field relief means consisted of a single field plate 21b with no field relief regions 21a and the field plate was connected by a contact area 25 to a region of the diode 13 string of the protection device which, in operation of the component, is designed to be such that the maximum voltage difference between the contact area 25 and the source electrode is 150 volts and the maximum voltage difference between the contact area 25 and the anode or drain electrode is 200 volts.

Figure 5:
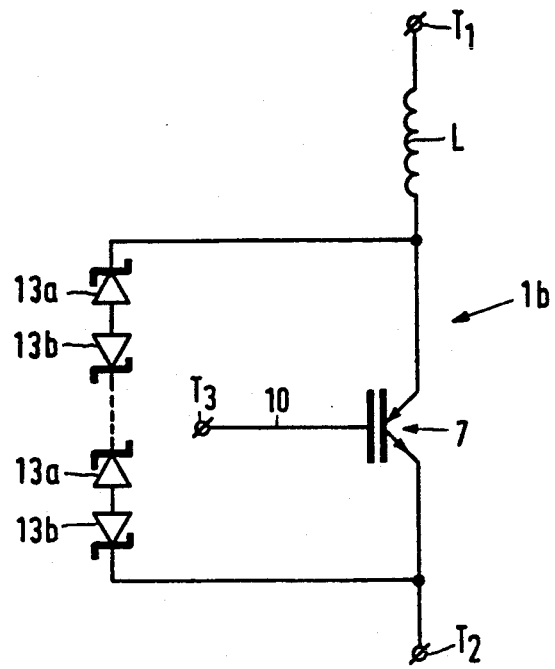
FIG. 5 is a circuit diagram of a second embodiment of a semiconductor component in accordance with the invention.

FIG. 5 illustrates the circuit diagram of a second embodiment of a semiconductor component 1a in accordance with the invention.

As can be seen from FIG. 5, in this example the protection device 12 is connected directly between the main electrodes 8 and 9 of the power semiconductor device 7. Again, the power semiconductor device 7 may be an IGBT having a structure similar to that shown in FIG. 2 or an equivalent power MOSFET or a power bipolar. The protection device 12 may have a structure similar to that described above with reference to FIGS. 1 to 4.

In this example when the voltage at the electrode 8 rises (due for example to the switching of an inductive load connected in series with the electrode 8) so that when the predetermined limit is reached, the protection device 12 breaks down, generally by zener or avalanche breakdown, in a manner similar to that described with reference to the semiconductor component 1 shown in FIG. 1 except that in this case it is the protection element 12 which has to carry the current to dissipate the excessive energy and so effect voltage clamping.

Figure 6:
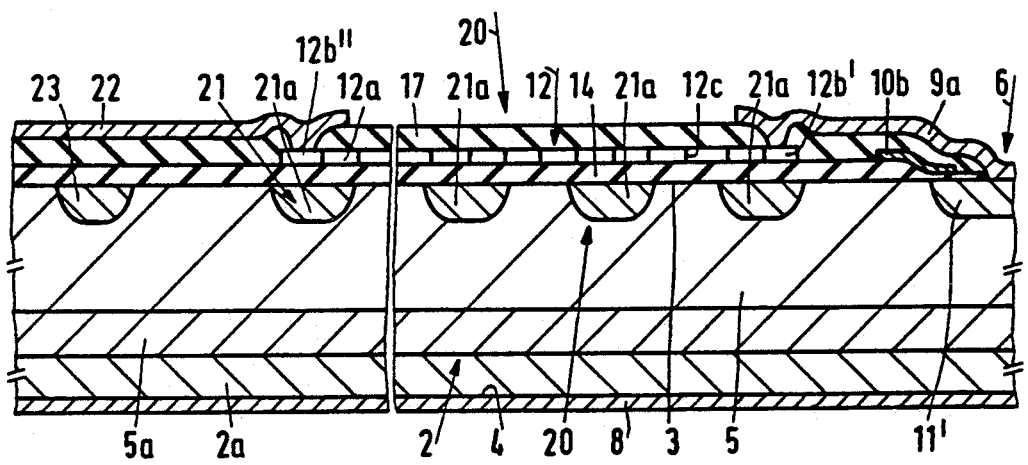
FIG. 6 is a cross-sectional view similar to that shown in FIG. 4 for illustrating the protection device and part of the field relief means of the second embodiment of a semiconductor component in accordance with the invention.

FIG. 6 is a cross-sectional view similar to FIG. 4 of one example of the field relief means 20 and protection device 12 of the semiconductor component 1a shown in FIG. 5. The field relief means 20 may have any of the forms described above with reference to FIGS. 3 and 4, although as shown only the field relief regions 21a are provided.

The main difference between the structures shown in FIGS. 4 and 6 is, of course, that in FIG. 6 the cathode of the diode 13 closest to the periphery of the power semiconductor device 7 is connected to the electrode 9, the cathode electrode in the case of an IGBT. In the example shown, this is achieved by the provision of an appropriate window in the insulating layer 17 overlying the protection device 12 and by appropriate patterning of the semiconductor layer and the metallization forming the electrode 9 so that the gate conductive layer 10b is isolated from the protection device while the electrode 9 is connected via an extension region 9a to the protection device 12.

Figure 7:
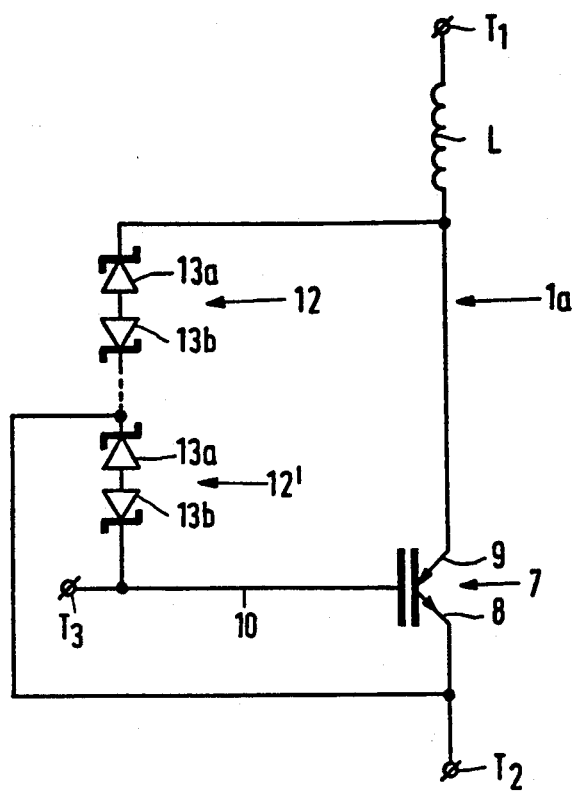
FIG. 7 is a circuit diagram of a third embodiment of a semiconductor component in accordance with the invention.

FIG. 7 is a circuit diagram of a third embodiment of a semiconductor component 1b in accordance with the invention. This component 1b is, as can be seen by a comparison of FIGS. 1 and 7, similar to FIG. 1 except that part 12' of the protection device 12 is also connected between the control electrode 10 and the other main electrode 9 (the anode electrode the case of an IGBT).

Figure 8:
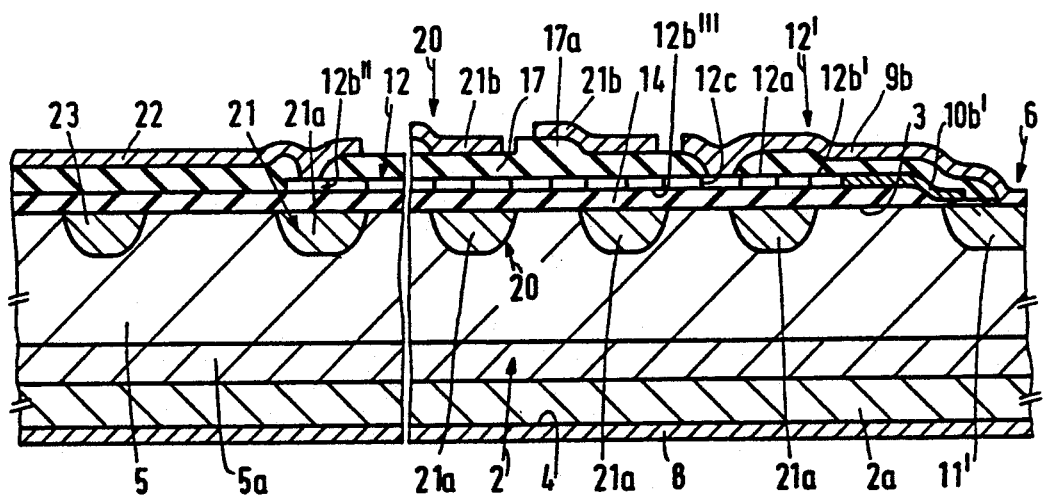
FIG. 8 is a cross-sectional view similar to that shown in FIG. 4 for illustrating the protection device and part of the field relief means of the third embodiment of a semiconductor component in accordance with the invention.

FIG. 8 is a cross-sectional view similar to FIGS. 4 and 6 showing only field relief regions 21a and the protection device 12 of the component 1b. Again, the field relief means 20 and the protection device 12 may have any of the structures described above with reference to FIGS. 1 to 6.

In the example shown, field relief regions 21a are provided together with overlying field relief plates 21b which extend laterally beyond the field relief regions 21a in a direction away from the power semiconductor device 7. As shown in FIG. 8, the depletion layer associated with the reverse-biassed pn junctions of the field relief regions 21a may be further shaped by causing the field relief plates to step up onto a thicker insulating region 17a in a direction away from the power semiconductor device 7.

As can be seen from a comparison of FIGS. 4, 6 and 8, in this case the electrode 9 is connected via an extension region 9b to the cathode 12b''' of an intermediate diode 13 of the protection device 12 while the insulated gate conductive layer 10b is connected via an extension 10b' to the cathode 12b' of the diode 13 closest to the periphery of the power semiconductor device 7.

This semiconductor component 1b operates in a manner similar to that shown in FIG. 1 with the main difference being that in the case of the example shown in FIG. 7, the further protection device 16 is not a separate device but is provided by part of the protection device 12.

Although in the examples described above, the protection device 12 is connected to the field relief means 20, the protection device 12 could be isolated from the field relief means 20 so that the voltage drop along the field relief means 20 is more independent of the voltage drop along the protection device 12.

Although in the examples described above, the protection device 12 is formed by thin film pn junction diodes 13, other rectifying elements, for example diode-connected thin film transistors, p-i-n diodes or Schottky diodes, could be used. As indicated above the present invention may be applied to power semiconductor devices other than IGBTs or power MOSFETs, for example certain forms of power bipolar transistors or power rectifying diodes. In addition, the invention may be applicable to devices with lateral current flow (i.e. along the major surfaces 3 and 4) rather than vertical current flow devices.

The conductivity types given above may be reversed and the present invention may be applied to semiconductor components other than silicon devices, for example germanium or III-V devices.

From reading the present disclosure, other modifications and variations will be apparent to persons skilled in the art. Such modifications and variations may involve other features which are already known in the semiconductor art and which may be used instead of or in addition to features already described herein.

I claim:

1. A semiconductor component comprising a semiconductor body having first and second major surfaces with, adjacent the first major surface, a first region of one conductivity type part of which defines an active device location of a power semiconductor device having at least two electrodes, active device regions each forming with the first region a pn junction extending to the first major surface, and a protection device comprising a series-connected array of semiconductor rectifying elements provided on an insulating layer on the first major surface, the protection device being connected between at least two electrodes of the power semiconductor device so as to break down to cause conduction between the two electrodes when the voltage across the protection device exceeds a predetermined limit, characterized in that the active device location is surrounded by field relief means comprising at least one field relief area extending along the first major surface for causing electric fields within the active device location to spread laterally outwardly of the active device location so as to increase the breakdown voltage of the power semiconductor device and in that the protection device is provided adjacent the field relief means so that the array of rectifying elements extends across at least one field relief area.

2. A semiconductor component according to claim 1, wherein each active device region contains a further region of the one conductivity type and an insulating gate structure provided on the first major surface overlies conduction channel regions defined by the active regions, said conduction channel regions being located between the further and first regions, the further regions being connected to a first main electrode, the first region being connected to a second main electrode and the insulated gate being connected to a control electrode of the power semiconductor device.

3. A semiconductor component according to claim 2, wherein the insulated gate structure has a doped semiconductor gate and the protection device is formed from the doped semiconductor.

4. A semiconductor component according to claim 1, wherein the protection device comprises an array of series-connected thin-film diodes provided by alternate p and n conductivity regions formed in a semiconductor layer such that the array of diodes extends along the semiconductor layer.

5. A semiconductor component according to claim 1, wherein the protection device is connected to the field relief means.

6. A semiconductor component according to claim 5, wherein each field relief area is connected to a selected one of the rectifying elements forming the protection device.

7. A semiconductor component according to claim 1, wherein the field relief means comprises a number of field relief regions of the opposite conductivity type formed spaced apart within the first region so as to surround the active device location.

8. A semiconductor component according to claim 1, wherein the field relief means comprises field plate means extending outwardly along the first major surface.

9. A semiconductor component according to claim 7, wherein the field relief means further comprises field plate means extending outwardly along the first major surface so as to define spaced-apart field plate areas with each field plate area overlying a respective field relief region.

10. A semiconductor component according to claim 9, wherein each field plate area is connected to the associated field relief region.

11. A semiconductor component according to claim 1, wherein the protection device is connected between two main electrodes of the power semiconductor device.

12. A semiconductor component according to claim 1, wherein at least part of the array of semiconductor rectifying elements is connected between one main electrode and a control electrode of the power semiconductor device.

* * * * *